STACKED ELECTRODE FIELD EFFECT TRIODE

Filed June 1, 1965

INVENTORS.
BENJAMIN KAZAN,
JOHN S. WINSLOW,
BY THEIR ATTORNEYS
Spensley & Horn 3,384,792
Patented May 21, 1968

3,384,792

STACKED ELECTRODE FIELD EFFECT TRIODE

Benjamin Kazan, Pasadena, and John S. Winslow, Altadena, Calif., assignors to Electro-Optical Systems, Inc., Pasadena, Calif., a corporation of California Filed June 1, 1965, Ser. No. 460,194
1 Claim. (Cl. 317—235)

ABSTRACT OF THE DISCLOSURE

Insulated gate field effect transistor structures wherein thin film electrodes are arranged in overlying layers, a small area source electrode being disposed between larger area drain and gate electrodes, the drain and source film electrodes being on opposite sides of a semiconductor layer whereby the drain-source electrode spacing is determined solely by the semiconductor layer thickness.

*Background of the invention*

The field-effect transistor (FET), also known as the unipolar transistor, is a solid-state device having operating characteristics similar to those of a pentode vacuum tube. Unlike the junction transistor which is operated with its emitter-base input circuit forward biased, thereby providing a low input impedance, the field effect transistor is operated with its input circuit reverse biased and thus is characterized by a very high input impedance. The FET is also characterized by low parasitic capacitances, low noise, and good thermal stability.

The many advantages of the unipolar field effect transistor over present day bipolar transistors and vacuum tubes has been long recognized. However, it has not been until recently that advancement of semiconductor technology, particularly that related to surfaces, oxides, and precision geometric control, has enabled realization of the inherent advantages of the FET structure. The recently introduced insulated gate field effect transistor (IGFET), also referred to as the metal-oxide-semiconductor transistor (MOST), provides a structure wherein the properties of FET's can be improved upon and combined with excellent high frequency capabilities. Higher input impedance, lower capacitance and performance to hundreds of megacycles are characteristics inherent in the IGFET. A thin film IGFET structure has been developed, the transistor being fabricated by evaporation of all components onto an insulating substrate. An IGFET fabricated entirely by vacuum evaporation is well suited to applications requiring large arrays of identical elements, such as cascaded amplifier stages, for example. The present invention is directed toward improved insulated gate field effect transistor structures fabricated by vacuum evaporation.

*Summary of the invention*

Whereas in the conventional IGFET structure the various electrodes are disposed in a substantially lateral alignment with the source and drain electrodes at opposite ends of the thin semiconductor body and with the gate electrode centrally disposed over the space between them, in accordance with the present invention IGFET structure the various electrodes are disposed in a vertical stack of layers deposited on the insulating substrate with the gate electrode uppermost and the drain electrode lowermost, the semiconductor body being sandwiched between the source and drain electrodes. This sandwich type structure is easily fabricated using the vacuum evaporation technique, the film forming the drain electrode being evaporated directly onto the insulating substrate, a film of semiconductor material being evaporated onto the drain electrode film, a source electrode strip then being formed by evaporation onto the semiconductor film, after which an insulating coating is evaporated over the source electrode and the semiconductor film. The source electrode is preferably in the form of a narrow strip or grid of strips so that a potential on the gate electrode can set up a corresponding electric field in the semiconductor film.

Finally, the gate electrode film is evaporated onto the insulating oxide coating. The present invention structure provides several advantages over the conventional IGFET structure. First, in the conventional thin film transistor, lateral spacing of the drain and source electrodes requires accurate masking. Because of the vertical orientation of the electrodes in the present invention device, the source-drain electrode spacing is determined by layer thickness, and so only the thickness of the evaporation need be accurately controlled. The inherently uniform thin films deposited in the present invention process automatically produces the proper spacing. Also, in the conventional IGFET designs accurate alignment of the gate electrode is important to minimize the gate-drain capacitance as well as the gate-source capacitance. It is therefore necssary to keep the gate electrode small and accurately registered over the gap between the source and drain electrodes. In the present invention device, on the other hand, such accuracy in gate electrode positioning is unnecessary since the source electrode is confined to a small lateral area. The field from the gate into the semiconductor body thus extends around the edges of the source electrode. Furthermore, in the present invention structure the gate electrode is positioned relatively far away from the drain electrode so that the capacitance between them is quite low.

Additionally, in the conventional IGFET structure accuracy in the drain-source gap is dependent upon sharply formed drain and source electrode edges, which is much more difficult to achieve in present high evaporation techniques than is control of layer thickness. An additional advantage of the present invention structure becomes apparent when considering applications requiring a chain of cascaded field effect transistors. Using the present invention technique, such a chain configuration can be achieved merely by adding more layers to the basic sandwich, thereby resulting in a structure having the same lateral dimensions as a single transistor of the same type. To form a chain configuration in accordance with the conventional IGFET fabrication technique a large substrate would be used and the devices would be laterally disposed, perhaps in partially overlapping relationship, thereby resulting in a much bulkier device.

Accordingly, it is an object of the present invention to provide an improved field effect transistor structure.

It is also an object of the present invention to provide an improved insulated gate field effect triode structure.

It is another object of the present invention to provide improved field effect transistor manufacturing techniques.

It is a further object of the present invention to provide an improved IGFET manufacturing technique which does not require extremely accurate masking.

It is still another object of the present invention to provide an improved IGFET manufacturing technique wherein accurate positioning of the gate electrode is not required.

It is a yet further object of the present invention to provide an improved IGFET manufacturing technique wherein an accurately controlled source-to-drain gap width is readily achievable.

It is another object of the present invention to provide an improved IGFET structure characterized by relatively low interelectrode capacitances.

It is a further object of the present invention to provide an improved basic IGFET structure suitable for formation of tandem amplifier chains occupying relatively little lateral surface area.

The novel features which are believed to be characteristic of the invention, both as to its organization and method of operation, together with further objects and advantages thereof will be better understood from the following description considered in connection with the accompanying drawing in which a presently preferred embodiment of the invention is illustrated by way of example. It is to be expressly understood, however, that the drawing is for the purpose of illustration and description only, and is not intended as a definition of the limits of the invention.

*Description of the preferred embodiments*

Figure 1:
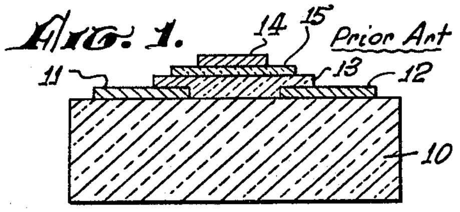
FIGURE 1 is a cross-sectional view, in elevation, of a conventional insulated gate field effect transistor.

Turning now to the drawing in FIGURE 1 there is shown a cross-sectional view of a conventional IGFET. Upon an insulating substrate 10 are disposed spaced apart source and drain electrodes, respectively identified by the reference numerals 11 and 12. The electrodes 11 and 12 are ordinarily formed of metals which make good ohmic contact to the semiconductor material utilized. A film of semiconductor material 13 is evaporated on the upper surface of the insulating substance 10 filling the gap between the source and drain electrodes and partially overlapping them as shown. Thus, the electrodes 11 and 12 provide good ohmic connection to opposite ends of the film of the semiconductor material 13. Cadmium sulfide is typically used as the semiconductor material, with gold being suitable for use as the source and drain electrodes. The thickness of the semiconductor film is usually less than one micron and the source-drain electrode spacing is typically within the range of from about 5 to about 50 microns. Atop the structure is a gate electrode 14 separated from the semiconductor film by a thin evaporated layer 15 of insulating material, such as silicon monoxide for example. The insulating substrate is typically a glass plate, the thin film electrodes, semiconductor material, and insulating material being deposited thereon by an evaporating technique.

The source electrode is analogous to the emitter of a junction transistor or the cathode of a vacuum tube, the drain being analogous to the collector of a junction transistor or the plate of a vacuum tube. Conductance in an IGFET is by means of majority carriers, unlike the bipolar transistor which relies on the flow of minority carriers to produce the transistor action.

Both P channel and N channel IGFET's may be fabricated, in accordance with the type of semiconductor and electrode materials used. For example, in an N channel device the semiconductor film 13 is of P type conductively and the metallic electrode contacts 11 and 12 are doped with N type active impurities. Conduction is by electrons and is confined to a subsurface channel in the semiconductor film. Conduction can be produced in one of two ways, either by an existing N region built in during the device fabrication, or by creation of an N type inversion layer by action of the field produced by the gate. Conduction through the N channel, produced by an electric potential applied between the source and drain electrodes, is modulated by the field produced by the gate potential. In this case, however, there is no flow of gate current because of the insulating layer 15 between the gate electrode 14 and the semiconductor material 13. The result is an extremely high input impedance. Pinch-off in this device takes place when the interaction of gate voltage and voltage drop along the channel is such that the net gate to channel voltage causes the channel to taper to zero depth. Channel current after pinch-off is then essentially independent of drain voltage.

An insulated gate field effect transistor can be fabricated so that operation can take place in the "enhancement" mode or in the "depletion" mode. In the type of structure operating in the enhancement mode no surface channel exists at zero gate voltage, and only drain leakage current flows until the inversion layer is created and "enhanced" by the the applied gate voltage. In a device fabricated for operation in the depletion type mode (which device can also be operated in the enhancement mode) an appreciable drain current exists at zero gate voltage because the device is fabricated to provide a native inversion layer at the surface. This offset current permits operation in a zero bias mode. It is then necessary to apply a negative gate voltage to "deplete" the drain current, reducing it toward zero.

Precision masking techniques are utilized in the fabrication of the device of FIGURE 1 since close spacing of the source and drain electrodes is desirable in order to obtain the highest possible transconductance, and since the gate electrode should be accurately registered over the drain-source gap. It is readily apparent that realization of the full potential of the conventional IGFET structure is dependent upon the ability to fabricate the device with the necessary precision and control. Recent developments in photolithographic and planar diffusion techniques have enabled production of reliable IGFET's. For example, photolithographic accuracy can now be held to a tolerance of less than one micron, to obtain a channel width of only a few microns on a typical conventional IGFET. Planar diffusion techniques have contributed much to the passivation of surfaces and toward significant reduction in the density of deep surface traps. However, because of the high precision and close control necessary in the fabrication of reliable conventional IGFET structures the manufacturing process is relatively tedious and costly. The present invention provides a novel IGFET structure with improved operating characteristics, and which structure can be easily fabricated with a high degree of precision. The fabrication of such a device will be explained with reference to FIGURES 2–6.

The present invention devices are fabricated by using vacuum evaporation techniques, the various layers being deposited upon an insulating substrate, such as a thin glass body indicated by the reference numeral 20 in FIGURES 2–6 of the drawing. Onto the upper surface 21 of the glass substrate 20 is evaporated a metallic film which forms the drain electrode 22. The selection of the semiconductor material and the materials for the drain, gate and source electrodes are in accordance with present art practices and are determined by the desired device conduction characteristics. The vacuum evaporation techniques used in the fabrication of the present invention device are those used in the fabrication of the conventional IGFET structure, and the same considerations and precautions apply. In the illustrated example the drain electrode 22 is of gold and is formed by evaporation onto the upper surface 21 of the glass substrate.

Figure 3:
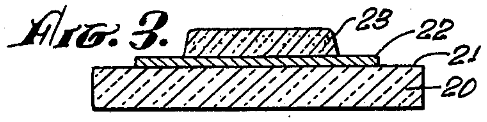

A layer 23 of semiconductor material is then evaporated onto the central portion of the drain electrode 22, the device then appearing as shown in FIGURE 3. In the illustrated example the semiconductor material is cadmium sulfide and is evaporated to provide a layer which is four microns in thickness. After the cadmium sulfide layer is evaporated onto the gold, the substrate is baked in a vacuum for about 30 minutes at a temperature of about 450° C.

Figure 4:
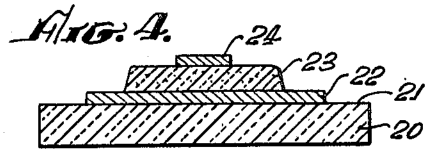
FIGURES 3–6 are elevational views, in cross-section, showing the insulating substrate of FIGURE 2 in various succeeding stages of fabrication of the present invention device.
Figure 2:
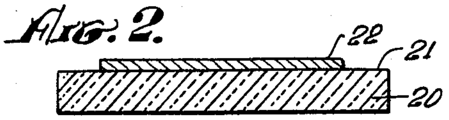
FIGURE 2 is a cross-sectional view, in elevation, of a body of insulating material upon which has been evaporated a conductive layer in a beginning stage of the fabrication of the present invention device.

A source electrode 24 is then evaporated onto the central portion of the semiconductor layer 23. In the illustrated example the source electrode is aluminum. A cross-section of the device at this stage of fabrication is shown in FIGURE 4.

Figure 5:
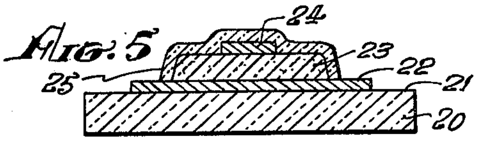

Next, a layer of insulating material, such as an oxide coating 25 is evaporated over the source electrode 24 and the semiconductor layer 23 using conventional masking techniques. A cross-section of the device will then appear as shown in FIGURE 5. In the illustrated example the insulating coating is a 0.2 micron thick layer of SiO.

Figure 6:
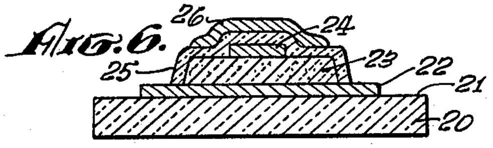

Finally, a metallic layer is evaporated onto the oxide coating to form a gate electrode 26, a cross-section of the completed device (electrical connection to the source electrode being omitted in the interest of clarity) is shown in FIGURE 6. In the illustrated example the gate electrode is aluminum and is of larger area than that of the underlying source electrode 24.

In the present invention IGFET structure the source-drain spacing is determined by the thickness of the semiconductor layer 23. Such thin films of uniform and predetermined thickness can be readily deposited to extremely close tolerances. In the illustrated example a source-drain spacing of 4 microns was established in a device having an active area of about 0.005 cm.$^2$, the device exhibiting a transconductance on the order of 100 micromhos. Note also in the embodiment of FIGURE 6 extreme accuracy in the positioning of the source electrode 24 is unnecessary since the gate-drain path is outside the area of the source electrode. Also, the gate-drain capacitance is relatively low due to the physical spacing of these electrodes. It is important to make the source electrode 24 of relatively small area as compared to the gate and drain electrode areas in order that the field from the gate can penetrate into the semiconductor, and to insure a relatively low interelectrode capacitance. The source electrode may be in the form of a narrow conductive strip, a set of parallel strips individually or collectively controlled, or a perforated conductor. In the present invention structure current flow from the source to the drain spreads laterally through the semiconductor body. As in the conventional IGFET structure, the gate electrode will modulate the conductivity of the semiconductor material directly beneath it. Since a substantial portion of the semiconductor is influenced by the field from the gate electrode, the current flow through the semiconductor can be modulated by the gate.

Figure 7:
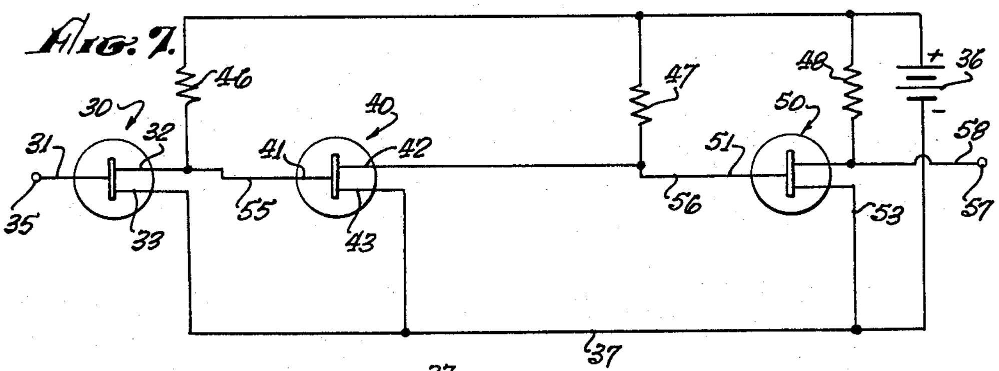
FIGURE 7 is an electrical schematic diagram of a direct-coupled field effect transistor amplifier chain.

The insulated gate field effect triode is particularly suitable for use in direct coupled amplifier stages, since the insulated gate electrode can be biased positively as well as negatively without drawing appreciable gate current. FIGURE 7 of the drawing is a schematic diagram of a three-stage direct coupled amplifier circuit using IGFET's is generally indicated by the reference numerals 30, 40 and 50. Each of the IGFET's has a gate electrode, respectively indicated by the reference numerals 31, 41 and 51, a drain electrode respectively indicated by the reference numerals 32, 42 and 52, and a source eelctrode respectively indicated by the reference numerals 33, 43 and 53. Amplifier input is applied to an input terminal 35 which is connected to the gate electrode 31 of the IGFET 30. Operating power for the amplifier change is provided by a source of D.C. potential, such as a battery 36. The source electrodes 33, 43 and 53 are connected to the negative terminal of the battery 36 through a common lead 37. The positive terminal of the battery 36 is coupled to the drain electrodes 32, 42 and 52 through respective load resistors 46, 47 and 48. The gate electrode 41 of the IGFET 40 is directly coupled to the drain electrode 32 of the IGFET 30 by an electrical lead 55. The gate electrode 51 of the IGFET 50 is directly connected to the drain electrode 42 of the IGFET 40 by an electrical lead 56. Amplifier output appears at an output terminal 57 which is directly connected to the drain electrode 52 of the IGFET 50 by an electrical lead 58.

Figure 8:
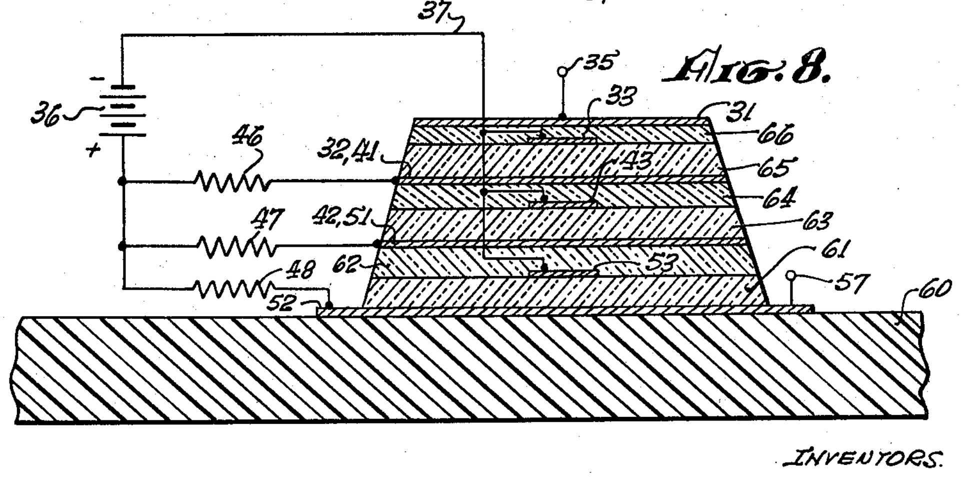
FIGURE 8 is a cross sectional view, in elevation, of a present invention device suitable for use in the circuit of FIGURE 7, together with a partial schematic diagram showing how the device is connected into the circuit.

In FIGURE 8 of the drawing there is shown how the present invention technique can be utilized to provide a multiple IGFET structure for use in the circuit of FIGURE 7. FIGURE 8 also contains a partial schematic diagram with individual components numbered identically with their counterparts in the diagram of FIGURE 7. The IGFET's are formed by vertically stacking the various electrodes on a single insulating substrate 60. The insulating substrate 60 may be larger than necessary for the particular amplifier circuit of FIGURE 7 in order that other circuitry may be formed by evaporation onto the same substrate, together with interconnecting leads, for example. The multiple-IGFET structure is formed on the substrate 60 entirely by the evaporation technique, as explained hereinabove. The output drain electrode 52 is first formed on the upper surface of the insulating substrate 60, followed by a layer of semiconductor material 61. The source electrode 53 is then evaporated onto the upper surface of the semiconductor layer 61. The common electrical lead 37 is connected in ohmic contact with the source electrode 53 and brought out for connection with the other source electrodes and the battery 36. An insulating oxide layer 62 is then evaporated over the source electrode 53 and the remaining exposed portion of the upper surface of the semiconductor layer 61. Next, a metallic layer is evaporated onto the oxide layer to form both the drain electrode 42 of the IGFET 40 in FIGURE 7 and the gate electrode 51 of the IGFET 50, thereby eliminating the necessity for the interconnecting lead 56 shown in FIGURE 7.

Then, a series of further evaporations are performed to successively form a semiconductor layer 63, the source electrode 43, an insulating oxide layer 64, a metallic layer which functions both as the drain electrode 32 and the gate electrode 41 (thereby eliminating the necessity of the interconnecting lead 55 in the schematic diagram of FIGURE 7), a semiconductor layer 65, the source electrode 33, an insulating oxide layer 66, and the gate electrode 31. The input terminal 35 is established in low resistance ohmic connection to the input gate electrode 33, and the output terminal 57 established in low resistance ohmic contact to the output drain electrode 57. The remainder of the circuit is indicated schematically.

The significant reduction in lateral area of the structure of FIGURE 8, as compared with that necessary for fabrication of the circuit of FIGURE 7 using conventional IGFET structures, is readily apparent. Various other direct coupled circuits are possible, using the vertically stacked electrode technique of the present invention. For example, a structure may be fabricated wherein a common gate controls multiple sources with one drain, or interconnected individual drains.

Thus there has been described an improved insulated gate field effect triode structure wherein the electrodes are stacked vertically upon an insulating substrate, thereby providing a device with improved operating characteristics and wherein electrode spacing is determined by film thickness.

Although the invention has been described with a certain degree of particularity, it is understood that the present disclosure has been made only by way of example and that numerous changes in the details of construction and the combination and arrangement of parts may be resorted to without departing from the spirit and the scope of the invention as hereinafter claimed.

We claim:

1. An insulated gate field effect transistor structure formed on an insulating substrate, comprising:

(a) a first drain electrode of a first metal disposed on said insulating substrate;

(b) a first layer of semiconductor material disposed on said first drain electrode;

(c) a first source electrode comprising a metal film disposed on a central portion of said first layer of semiconductor material, said first source electrode being of smaller lateral area than said first drain electrode;

(d) a first layer of electrical insulating material disposed on and covering the exposed portions of said first source electrode and first layer of semiconductor material;

(e) a second drain electrode of said first metal of larger lateral area than said first source electrode disposed on said first layer of electrical insulating material, overlying said first source electrode and extending laterally therebeyond;

(f) a second layer of semiconductor material disposed on said second drain electrode;

(g) a second source electrode disposed on a central portion of said second layer of semiconductor material, said second source electrode being of smaller lateral area than said second drain electrode;

(h) a second layer of electrical insulating material disposed on and covering the exposed portion of said second source electrode and second layer of semiconductor material;

(i) a gate electrode of larger lateral area than said second source electrode disposed on said second layer of electrical insulating material, overlying said second source electrode and extending laterally therebeyond;

(j) means for connecting said drain electrodes to a point of common potential; and (k) means for electrically connecting a source of D.C. potential between said point of common potential and said source electrodes.

References Cited

UNITED STATES PATENTS

| | | | |
|---|---|---|---|
| 3,293,512 | 12/1966 | Simmons et al. | 317—235 |
| 3,320,464 | 5/1967 | Dill | 317—235 |

FOREIGN PATENTS

| | | |
|---|---|---|
| 1,037,293 | 4/1953 | France. |

JOHN W. HUCKERT, *Primary Examiner.*

J. D. CRAIG, *Assistant Examiner.*